| (12) United States Patent | (10) Patent No.: | US 7,788,552 B2 |
| Gholami et al. | (45) Date of Patent: | Aug. 31, 2010 |

(54) METHOD TO IMPROVE ISOLATION OF AN OPEN NET FAULT IN AN INTERPOSER MOUNTED MODULE

(75) Inventors: Ghadir R. Gholami, Austin, TX (US); Mark D. McLaughlin, Austin, TX (US); Jorge N. Yanez, Leander, TX (US)

(73) Assignee: International Business Machines Corporation, Armonk, NY (US)

( * ) Notice: Subject to any disclaimer, the term of this patent is extended or adjusted under 35 U.S.C. 154(b) by 547 days.

(21) Appl. No.: 11/672,555

(22) Filed: Feb. 8, 2007

(65) Prior Publication Data

US 2008/0191704 A1 Aug. 14, 2008

(51) Int. Cl.
*G01R 31/317* (2006.01)
*G01R 31/40* (2006.01)

(52) U.S. Cl. .................. 714/715; 714/712; 324/527

(58) Field of Classification Search .................. None
See application file for complete search history.

(56) References Cited

U.S. PATENT DOCUMENTS

| 5,517,515 | A |   | 5/1996  | Spali et al. ............. 371/22.5 |
| 5,977,831 | A | * | 11/1999 | Davis et al. ............... 330/279 |
| 6,222,669 | B1 | * | 4/2001  | Roberts et al. ............ 359/337 |
| 6,344,748 | B1 | * | 2/2002  | Gannon .................... 324/542 |
| 2002/0095633 | A1 | * | 7/2002 | Pillkahn .................... 714/734 |
| 2003/0122565 | A1 | * | 7/2003 | Van Horn et al. .......... 324/754 |

* cited by examiner

*Primary Examiner*—Kevin L Ellis
*Assistant Examiner*—Dipakkumar Gandhi
(74) *Attorney, Agent, or Firm*—Matthew W. Baca; Jack V. Musgrove

(57) ABSTRACT

A multi-chip module (MCM) assembly has two modules interconnected by respective interposers and a printed circuit board, and diagnostic logic within the modules uses the principal of signal reflection to located any open fault in the circuit path across the interposers. A first test signal is sent from module to the other and a determination is made as to whether any reflected signal represents an open fault of the circuit path at either of the interposers. If a reflected signal is received during a predetermined time, the diagnostic logic concludes that a single open fault exists only at the far interposer. If no reflected signal is received then the diagnostic logic concludes that there is at least one open fault at the near interposer, and the second module runs a similar test to check to see if both interposers have failures.

15 Claims, 4 Drawing Sheets

METHOD TO IMPROVE ISOLATION OF AN OPEN NET FAULT IN AN INTERPOSER MOUNTED MODULE

BACKGROUND OF THE INVENTION

1. Field of the Invention

The present invention generally relates to packaging for integrated circuits, and more particularly to a method of testing an interposer used to interconnect multi-chip modules.

2. Description of the Related Art

Integrated circuits are used for a wide variety of electronic applications, from simple devices such as wristwatches, to the most complex computer systems. A microelectronic integrated circuit (IC) chip can generally be thought of as a collection of logic cells with electrical interconnections between the cells, formed on a semiconductor substrate (e.g., silicon). An IC may include a very large number of cells and require complicated connections between the cells. A cell is a group of one or more circuit elements such as transistors, capacitors, resistors, inductors, and other basic circuit elements grouped to perform a logic function. Cell types include, for example, core cells, scan cells and input/output (I/O) cells. Each of the cells of an IC may have one or more pins, each of which in turn may be connected to one or more other pins of the IC by wires. The wires connecting the pins of the IC are also formed on a surface of the chip.

As the size of integrated circuits continues to shrink and pin densities grow, it has become increasingly more difficult to interconnect the chip to external circuitry or other chips. One packaging technique that allows for tighter interconnection of multiple chips is the multi-chip module (MCM). An MCM has two or more IC chips (dies) mounted on a single substrate or carrier that provides direct connections between the mounted chips as well as connections to external circuitry such as a printed circuit board (PCB). MCMs achieve higher performance resulting from reduced signal delays between chips, improved signal quality between chips, and a reduced number of external components.

For high performance computing applications, the use of high-function, high-cost MCM processors has made it desirable to attach these modules to the PCBs so that they can be replaced without having to desolder the part, i.e., as field replaceable units. The use of multiple MCMs in a single circuit assembly has also increased. FIG. 1 illustrates one example of a high performance, glass-ceramic MCM assembly 1. MCM assembly 1 has two replaceable MCMs one of which 2 is shown. MCM 2 includes microprocessor dies 3a, 3b mounted on a cordierite glass-ceramic carrier 4 having internal copper wiring (MCM 2 has four microprocessors but only two are visible in the side view of FIG. 1). Contact pins of the MCMs are soldered to I/O pads on the top surface of carrier 4 that are connected to the internal wiring network. An underfill material (organic capsulant) is dispensed along the edges of the dies and cured, and a heat spreader 5 is applied to the top of the dies using a thermally conductive adhesive. A lid 6 is laid over the heat spreaders and secured to carrier 4 with a silicone adhesive and cured to form a seal about MCM 2. A set screw may be inserted into a threaded hole in the top of lid 6 to adjust a spar that tightens the MCM and limits substrate flexure. A heat sink 7 is mounted on lid 6.

An interposer 8 is used to provide interconnections between MCM 2 and a card or PCB 9. Interposer 8 is an insulating layer having a multitude of embedded conductive elements 10 arranged in a land grid array (LGA), and aligned with respective metallized I/O pads on the MCMs and PCB 9. Conductive elements 10 are made from a compressible metal, and a spring-loaded actuation system 11 is employed to apply a normal retention force through MCM 2 along the peripheral seal against interposer 8 and PCB 9. PCB 9 can be further supported by a steel plate/stiffener 12. Interposers are provided for each MCM in the assembly. Chips in different MCMs can accordingly communicate along a circuit path from one MCM through its interposer to PCB 9 and thence to the interposer of the second MCM.

While the use of interposers greatly simplifies replacement of an MCM, the conductive elements 10 have been known to fail, causing an electrical open along a circuit path between chips on different modules. The interconnections between MCMs can be tested by system diagnostics integrated into the MCM chips. In the case of an interposer failure which causes an electrical open, the diagnostic can indicate a broken connection but cannot isolate the fault, i.e., it cannot determine which interposer along the circuit path has the malfunctioning element. Consequently, two or more interposers might have to be replaced even though only one is defective. It would, therefore, be desirable to devise an improved method of testing the integrity of interposers in a chip module assembly which could isolate a fault to a specific interposer. It would be further advantageous if the method could be implemented without requiring modifications to the interposers or excessive overhead to the MCM diagnostic logic.

SUMMARY OF THE INVENTION

It is therefore one object of the present invention to provide an improved method of testing the interconnections across interposers in a chip module assembly.

It is another object of the present invention to provide such a method which can isolate an open fault to a specific interposer in a circuit path having multiple interposers.

It is yet another object of the present invention to provide such a method which does not require modification to the interposers or excessive overhead to the MCM diagnostic logic.

The foregoing objects are achieved in a method of testing a module assembly having at least two chip modules with corresponding interposers by transmitting a test signal from the first chip module to the second chip module across a circuit path that includes the interposers, receiving any reflected signal of the test signal at the first chip module, and determining whether the reflected signal represents an open fault of the circuit path at either of the interposers. If a reflected signal is received during a predetermined time, the diagnostic logic of the chip modules concludes that a single open fault exists only at the far interposer. If no reflected signal is received then the diagnostic logic concludes that there is at least one open fault at the near interposer, and the second module runs a similar test to check to see if both interposers have failures. If a second test signal transmitted by the second module is reflected and received back at the second module then the diagnostic logic concludes that only the interposer at the first module is defective, but if no reflection is received then the diagnostic logic concludes that both interposers have failed.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
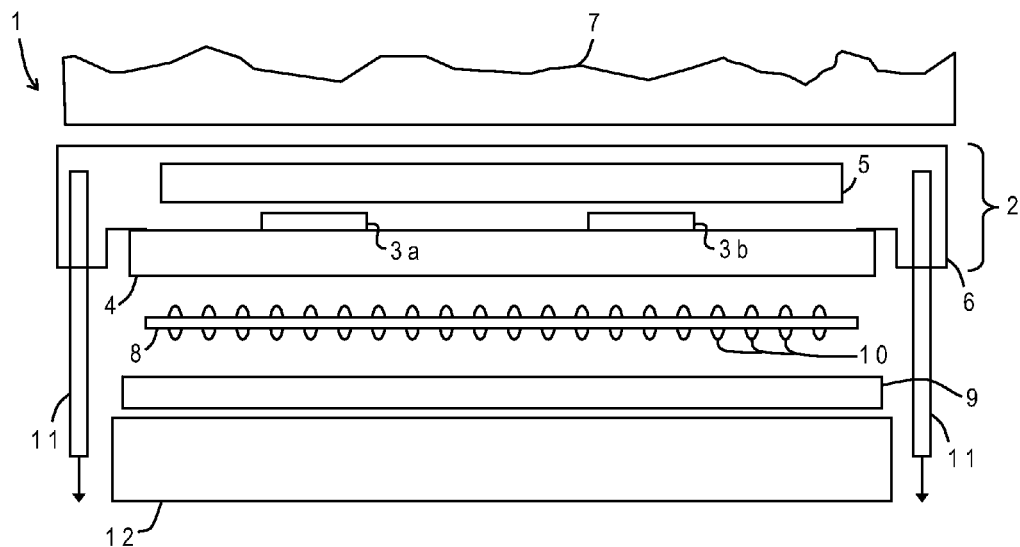
FIG. 1 is a side elevational view of a conventional multi-chip module (MCM) assembly which includes an MCM interconnected with a printed circuit board (PCB) via an interposer having deformable conductive elements.
Figure 2:
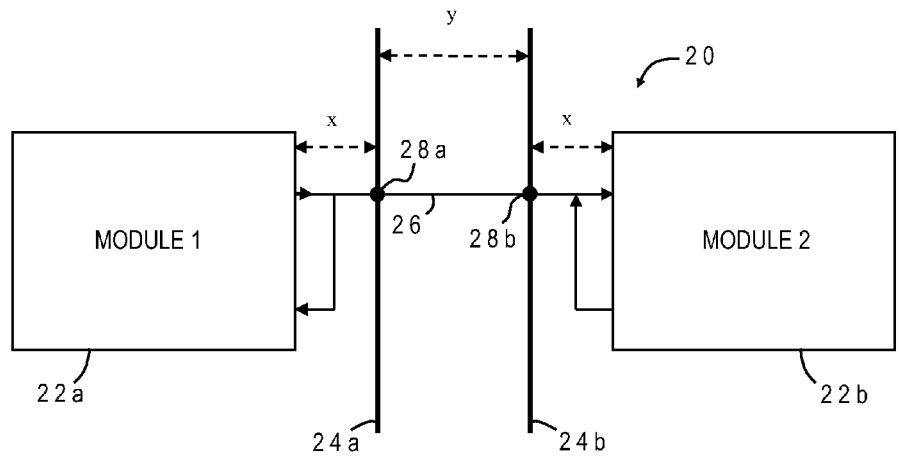
FIG. 2 is a geometrical representation of a circuit path of an MCM assembly constructed in accordance with one embodiment of the present invention wherein the circuit path interconnects one MCM to another MCM across two interposers and a PCB.

With reference now to the figures, and in particular with reference to FIG. 2, there is depicted a geometric representation of a circuit path for one embodiment 20 of a multi-chip module (MCM) assembly constructed in accordance with the present invention. MCM assembly 20 is generally comprised of a first MCM 22a, a second MCM 22b, a first interposer 24a, a second interposer 24b, and a card or printed circuit board (PCB) 26. The interposers may be, for example, land grid array (LGA) interposers and the circuit path passes through deformable metal contacts 28a, 28b located respectively in interposers 24a, 24b. MCM assembly 20 may include other features such as those described in conjunction with FIG. 1 to enhance or facilitate the interconnection of MCMs 22a, 22b via interposers 24a, 24b and PCB 26. While the invention is described in the context of MCMs, it is likewise applicable to the interconnection of single-chip modules which use interposers. Those skilled in the art will further appreciate that the invention is applicable to a variety of module assemblies that may have other constructions, for example an assembly which uses a flex circuit to interconnect the two interposers rather than a rigid PCB.

The depicted circuit path is only one of a multitude of circuit paths formed between the MCMs. If one of the deformable metal contacts 28a, 28b of the interposers in any of the circuit paths are defective or otherwise fail to make a proper electrical connection, it will cause an open net fault in that path and potentially render the assembly inoperative. The present invention uses the principal of signal reflection to determine which interposer has the failure that created the open circuit, so that only the malfunctioning interposer need be replaced rather than replacing two or more interposers.

Conventional diagnostic logic built into MCMs 22a, 22b is used to first detect any open fault(s) in the circuit paths. This connectivity diagnostic is applied sequentially to each circuit path across the interposers to check all interconnections of the assembly. When an open fault is found, the transmission line properties of the circuit path make it possible to further determine which end of the circuit is open by examining the reflection of a test signal using additional reflection diagnostic logic in accordance with the present invention. A pulse or test signal is generated by one of the modules under the test and sent to the I/O pads of the module substrate which should be in electrical contact with the conductive elements of the respective interposer. The pulse width is half (or less) of the wiring delay between the modules along the circuit path. As seen in FIG. 2, the wiring delay is equal to the propagation speed of the signal divided into the circuit path length which is 2x+y where x is the distance from a module to its interposer and y is the wire length along a portion of the PCB circuitry. However, since the modules are placed very close to the interposers, the x component of the delay can be ignored compared to the y component ($y \gg x$), so the wiring delay is approximately the signal delay across PCB 26. If the test signal is generated module 22a and the open fault is at interposer 24b of module 22b then the transmitted signal will reflect at the open fault and arrive at back at module 22a after a delay corresponding to about 2y. After sending the test pulse, the module under test will accordingly switch from a transmission mode to a receive mode in order to "listen" for any reflection of the test signal. Module 22a thus receives this reflection and with appropriate signal recognition logic determines that the fault lies at interposer 24b, and not at its associated interposer 24a.

If module 22a has not seen the reflected waveform after a predetermined amount of time (around the 2y delay), then the same test is carried out by module 22b. If the pulse reflection is seen by module 22b then the system diagnostic determines that the reflected signal represents a faulty interposer at the other side (interposer 24a). However, if the pulse is still not detected at module 22b after a predetermined time, then the system diagnostic concludes that both interposers are defective and need to be replaced.

Figure 3:
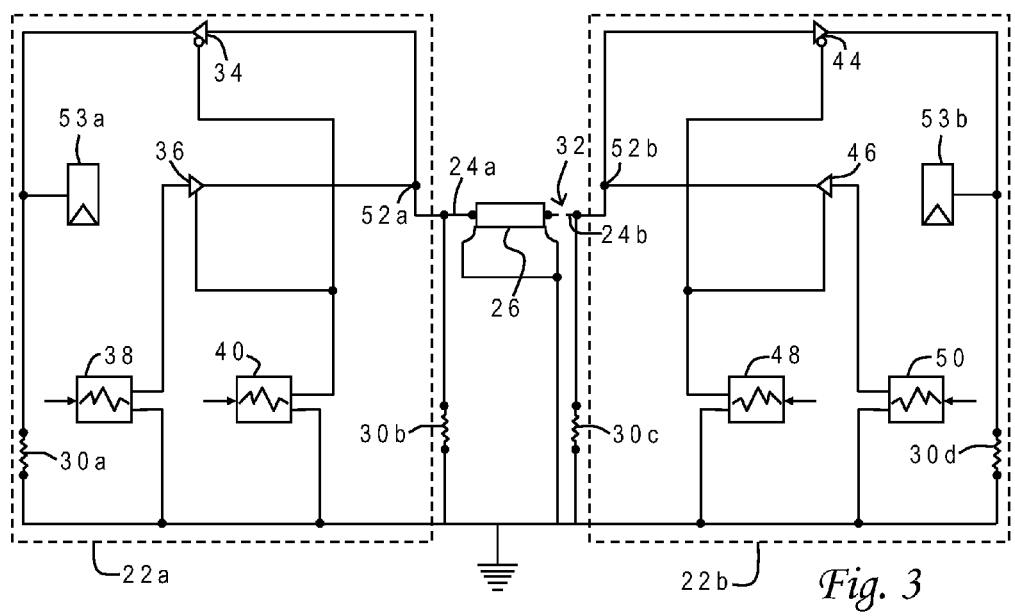
FIG. 3 is a schematic representation of the MCM assembly of FIG. 2 depicting an open connection (fault) in the circuit path.

Referring now to FIG. 3, the reflection diagnostic logic of the two MCMs 22a, 22b is shown schematically with the interposers and PCB connections. CABLE denotes the wiring delay between the two modules (effectively PCB 26) which is modeled as a loss-less transmission line. Resistors 30a, 30b, 30c, 30d are loading added for simulation purposes. In this example the open fault 32 is shown at interposer 24b.

Figure 4:
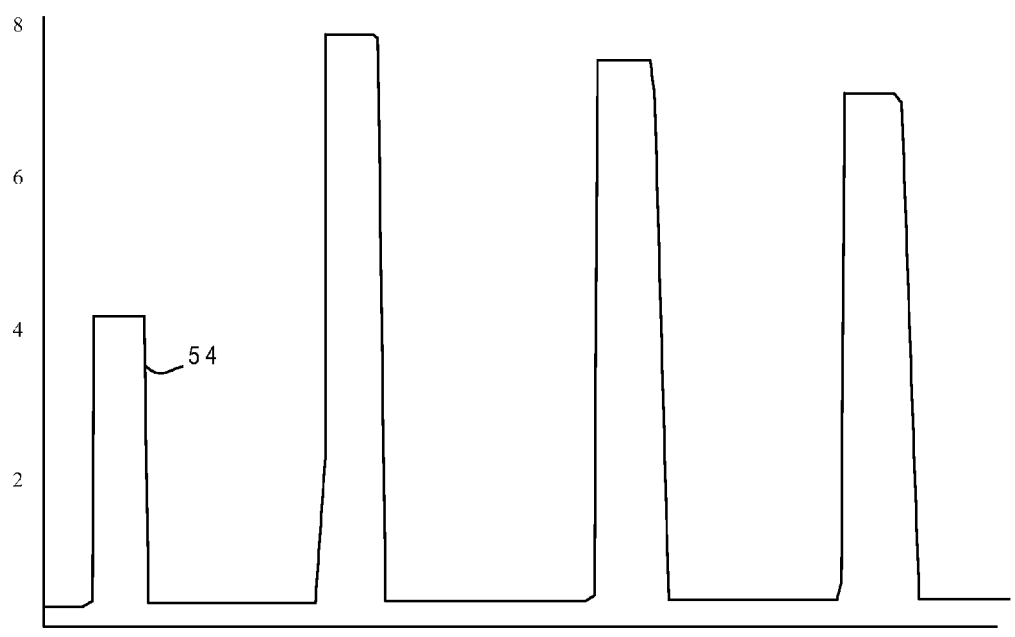
FIG. 4 is a timing diagram for a test signal transmitted at an input/output node of the first MCM in the assembly of FIGS. 2 and 3 in accordance with one implementation of the present invention.
Figure 5:
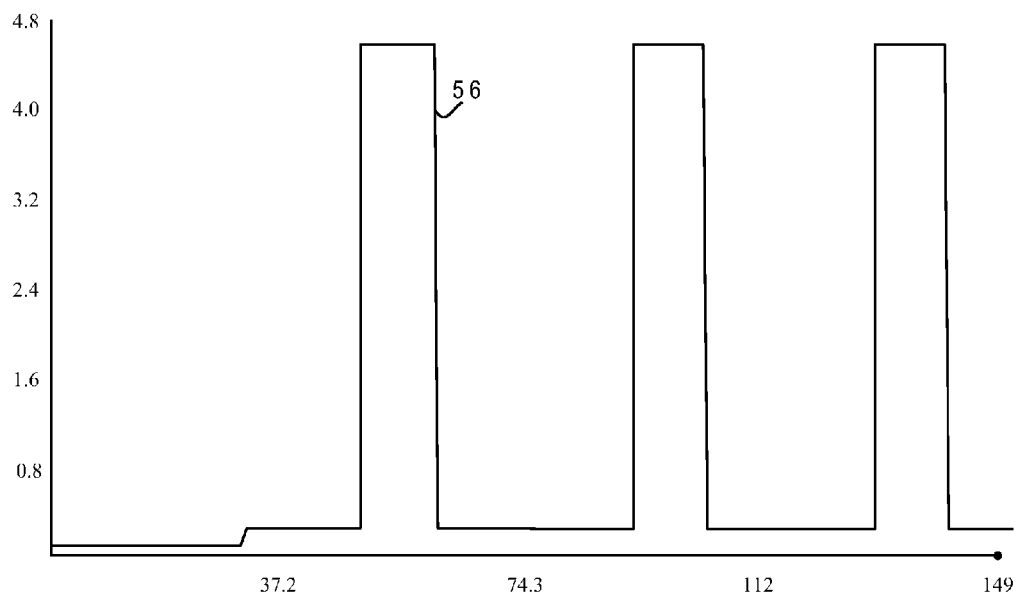
FIG. 5 is a timing diagram for a reflected signal received at the first MCM after transmitting the test signal when there is an open fault at the interposer of the second MCM in accordance with one implementation of the present invention.

If the pulse is launched from module 22a, the simulation results in the waveform 54 shown in FIG. 4 at input/output node 52a (the vertical scale is volts and the horizontal scale is nanoseconds). In this example the test pulse width is about 10 ns for a circuit path having a wiring delay of around 20 ns. The first peak of waveform 54 is the test pulse sent from module 22a, and the remaining three peaks are reflections of the original test pulse received at node 52a. The test pulse originates at a signal generator 38 and passes through an amplifier 36. Amplifier 36 is gated by a control (timing) signal from control logic 40. The inverse of the control signal is also used to gate another amplifier 34. During the transmission mode the control signal is active (high), turning on amplifier 36 and turning off amplifier 34. After a predetermined time control logic 40 switches to the receive mode and the control signal becomes inactive (low), turning off amplifier 36 and turning on amplifier 34. FIG. 5 shows the resulting waveform 56 at the output of amplifier 34. The three peaks in FIG. 5 correspond to the last three peaks of FIG. 4. The output of amplifier 34 thus provides a signal indicating whether the far interposer has an open fault, i.e., when the amplitude of the reflection is above the threshold voltage for the particular logic employed (e.g., CMOS or TTL) during the predetermined time interval.

The output of amplifier 34 is captured during the predetermined time interval by a scan latch 53a. Scan latch 53a is part of a scan ring in a level-sensitive scan design (LSSD) system of the chip module which generally complies with the Institute of Electrical and Electronics Engineers (IEEE) standard 1149.1 pertaining to a test access port and boundary-scan architecture. Scan systems allow information to be read from or written to the scan latches during operation of the system. The scan ring may be physically accessed by a JTAG port which is further connected to a workstation carrying out a test program. The test program will retrieve the value stored in scan latch 53a and provide an output to the user indicating the location of the open fault.

Figure 6:
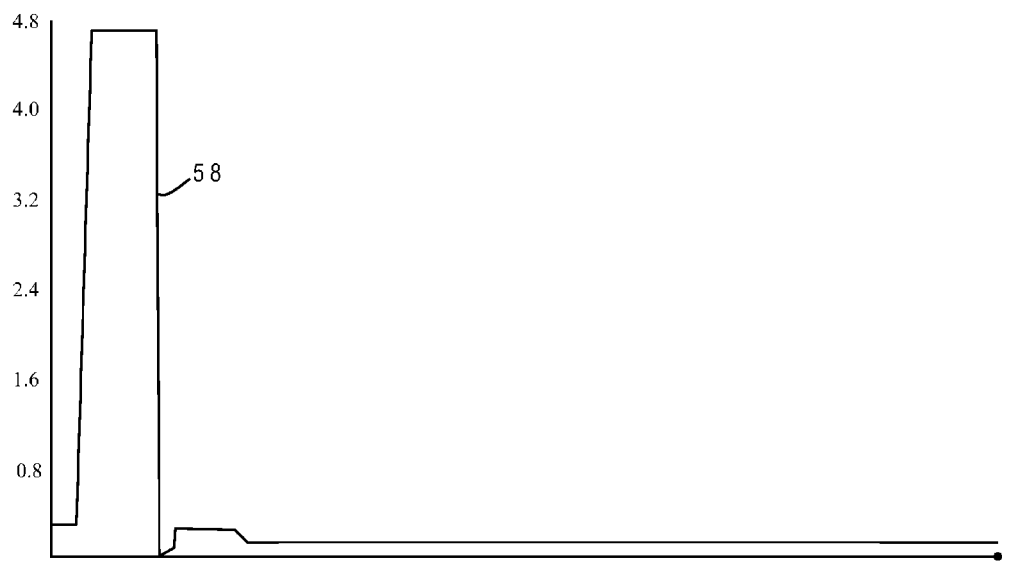
FIG. 6 is a timing diagram for a reflected signal received at the second MCM after the second MCM transmits the test signal when there is an open fault at the interposer of the second MCM in accordance with one implementation of the present invention.

The reflection diagnostic logic in MCM 22b is essentially identical to that in MCM 22a and includes another signal generator 50 connected to the input of an amplifier 46 which is controlled by a signal from control logic 48. The output of amplifier 46 is connected to the I/O node 52b of MCM 22b. The inverse of the control signal also gates amplifier 44 whose input is connected to 52b. The output of amplifier 44 is captured by another scan latch 53b. FIG. 6 illustrates a waveform 58 at the output of amplifier 44 which results from the reflection of a test pulse sent by signal generator 50.

Signal generators 38, 50 and control logic 40, 48 are responsive to commands from the system diagnostic logic. The system diagnostic logic may be embedded in MCMs 22a, 22b or may be part of the external test software. While only one circuit path is shown for FIG. 3 it is understood that switches are used to route the test signals and reflections along the particular circuit path that previous testing indicates is faulty.

Figure 7:
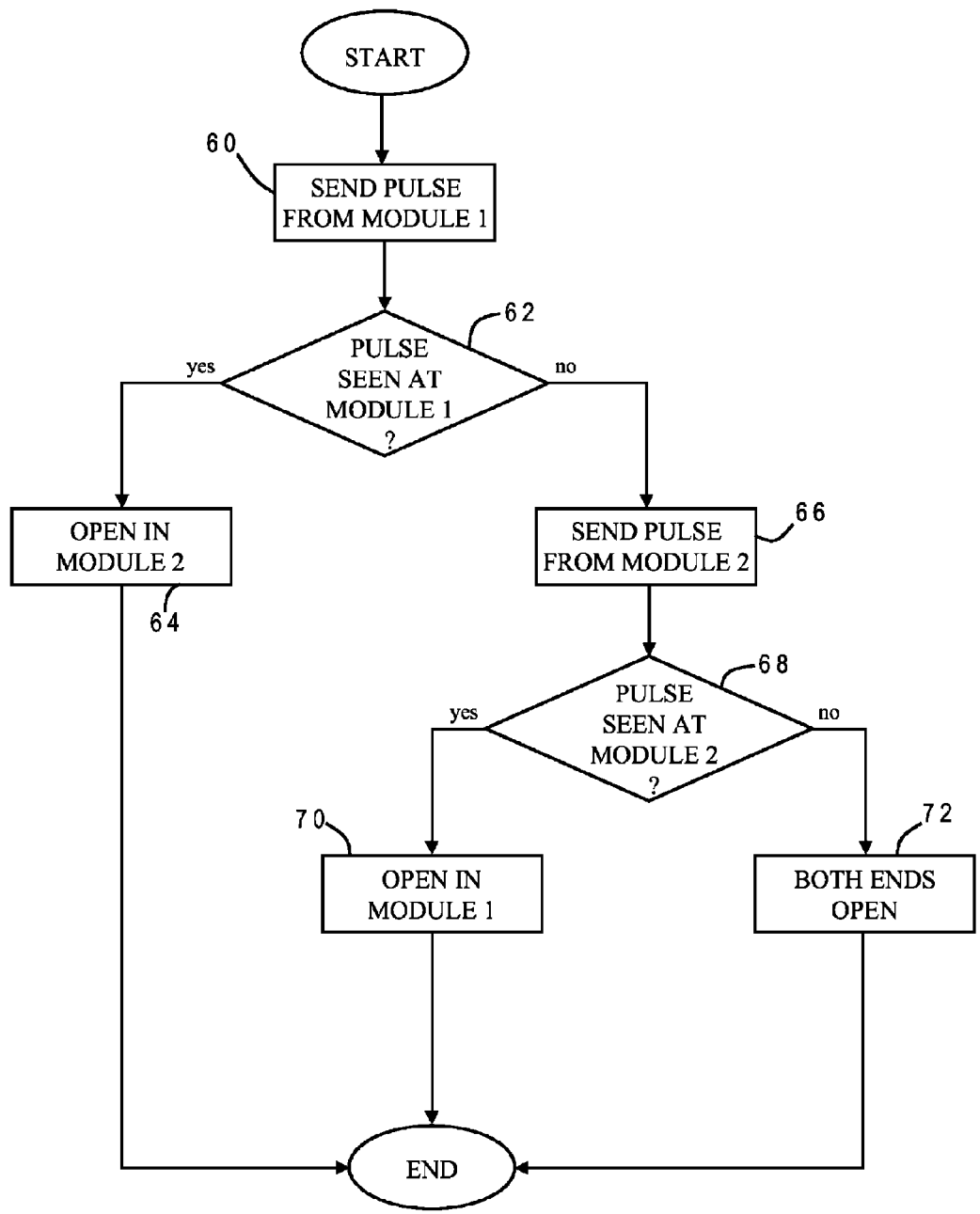
FIG. 7 is a chart illustrating the logical flow for diagnostic testing of the interposer connections in accordance with one implementation of the present invention.

The invention may be further understood with reference to the flow chart of FIG. 7. The reflection diagnostic test begins by sending a pulse from the first module (60). The diagnostic logic then branches depending on whether a timely reflected pulse is seen at the first module (62). If a reflection is detected, the logic determines that the open fault is at the interposer of the second module (64) and the process ends. If no reflected pulse is detected, the process signals the second module to send another test pulse (66). Another determination is made as to whether any reflected pulse is seen at the second module (68). If a reflection is detected, the logic determines that the open fault is at the interposer of the first module (70). If no reflected pulse is detected from this second test phase, the diagnostic logic concludes that there are faults at both interposers (72).

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. For example, while the invention has been described in the context of the specific geometry of two interposers interconnected by a PCB, the invention can be used with in module assemblies having more than two modules and/or more than two interposers, regardless of the structural variations in different types of interposers. It is therefore contemplated that such modifications can be made without departing from the spirit or scope of the present invention as defined in the appended claims.

What is claimed is:

1. A method of testing a module assembly having at least two chip modules, comprising:

first transmitting a first test signal from a second chip module to a first chip module across a circuit path that includes at least first and second interposers respectively connected to the first and second chip modules, each of said chip modules having diagnostic logic for transmitting test signals and receiving reflections of the test signals to locate an open fault in the circuit path;

first receiving no reflected signal of the first test signal at the second chip module within a predetermined time from said transmitting;

determining from said first receiving no reflected signal that there is at least one open fault in the circuit path at the second interposer;

second transmitting a second test signal from the first chip module to the second chip module across the circuit path;

second receiving a reflected signal of the second test signal at the first chip module; and determining from said first receiving no reflected signal and from said second receiving the reflected signal that there is only one open fault of the circuit path and the one open fault is at the second interposer.

2. The method of claim 1 wherein the reflected signal is determined to represent the open fault when its amplitude is above a threshold voltage during a predetermined time interval.

3. The method of claim 1 wherein each of the first and second test signals has a pulse width which is less than or equal to one-half of a wiring delay between the first and second chip modules along the circuit path.

4. The method of claim 3 wherein the wiring delay is approximately equal to the signal delay across a portion of a printed circuit board which interconnects the first and second interposers.

5. A method of testing a module assembly having at least two chip modules, comprising:

transmitting a first test signal from a first one of the chip modules to a second one of the chip modules across a circuit path that includes at least first and second interposers respectively connected to the first and second chip modules, each of said chip modules having diagnostic logic for transmitting test signals and receiving reflections of the test signals to locate an open fault in the circuit path;

determining that there is at least one open fault in the circuit path at the first interposer when no reflected signal of the first test signal is received at the first chip module within a predetermined time from said transmitting of the first test signal;

transmitting a second test signal from the second chip module to the first chip module across the circuit path in response to said determining; and further determining that there are open faults in the circuit path at both the first and second interposers when no reflected signal of the second test signal is received at the second chip module within a predetermined time from said transmitting of the second test signal.

6. The method of claim 5 wherein the predetermined times are approximately equal to twice the wiring delay between the first and second chip modules along the circuit path.

7. The method of claim 5 wherein the test signal has a pulse width which is less than or equal to one-half of a wiring delay between the first and second chip modules along the circuit path.

8. The method of claim 7 wherein the wiring delay is approximately equal to the signal delay across a portion of a printed circuit board which interconnects the first and second interposers.

9. A chip module comprising:
a substrate having upper and lower surfaces, a first plurality of connection pads on said upper surface, a second plurality of connection pads on said lower surface, and iring connecting said first plurality of connection pads to said second plurality of connection pads, wherein said second plurality of connection pads are adapted for interconnection with a replaceable interposer; and
at least one integrated circuit chip attached to said upper surface of said substrate with contact pins electrically connected to said first plurality of connection pads, said integrated circuit chip having diagnostic logic which transmits a test signal to at least one of said second plurality of connection pads during a transmission mode and detects any reflection of the test signal during a receive mode, wherein said diagnostic logic provides a signal indicating that an associated interposer is not defective but another interposer is defective when a reflection of the test signal is received within a predetermined time from transmission of the test signal.

10. The chip module of claim 9 wherein said diagnostic logic includes a signal generator connected to an input of a first amplifier whose output is connected to an input/output node.

11. The chip module of claim 10 wherein said diagnostic logic further includes:
a second amplifier whose input is connected to the input/output node and whose output is connected to a scan latch; and
control logic which turns on said first amplifier and turns off said second amplifier during the transmission mode, and turns off said first amplifier and turns on said second amplifier during the receive mode.

12. A chip module assembly comprising:
a printed circuit board;
at least first and second interposers in electrical contact with said printed circuit board;
at least first and second chip modules in respective electrical contact with said first and second interposers defining at least one circuit path between said chip modules across conductive elements of said interposers and a portion of said printed circuit board, each of said chip modules having diagnostic logic for transmitting test signals and receiving reflections of the test signals to locate an open fault in the circuit path by transmitting a first test signal from said first chip module to said second chip module across the circuit path and determining that no reflected signal of the first test signal was received, and transmitting a second test signal from said second chip module to said first chip module across the circuit path and determining that a reflected signal of the second test signal was received.

13. The chip module assembly of claim 12 wherein said first chip module transmits a test signal to said second chip module across the circuit path, receives a reflected signal of the test signal, and determines that the reflected signal represents an open fault of the circuit path only at said second interposer.

14. The chip module assembly of claim 12 wherein:
said first chip module transmits a first test signal to said second chip module across the circuit path and makes a determination that at least said first interposer is defective when no reflection of the first test signal is received within a predetermined time from transmission of the first test signal; and
in response to said determination, said second chip module transmits a second test signal to said first chip module across the circuit path and determines that only said first interposer is defective when a reflection of the second test signal is received within a predetermined time from transmission of the second test signal.

15. The chip module assembly of claim 12 wherein
said first chip module transmits a first test signal to said second chip module across the circuit path and makes a determination that at least said first interposer is defective when no reflection of the first test signal is received within a predetermined time from transmission of the first test signal; and
in response to said determination, said second chip module transmits a second test signal to said first chip module across the circuit path and determines that both said first interposer and said second interposer are defective when no reflection of the second test signal is received within a predetermined time from transmission of the second test signal.

* * * * *